(12) United States Patent
Sung

(10) Patent No.: US 9,852,905 B2
(45) Date of Patent: Dec. 26, 2017

(54) SYSTEMS AND METHODS FOR UNIFORM GAS FLOW IN A DEPOSITION CHAMBER

(71) Applicant: Taiwan Semiconductor Manufacturing Company, Ltd., Hsin-Chu (TW)

(72) Inventor: Su-Jen Sung, Hsinchu County (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/157,324

(22) Filed: Jan. 16, 2014

(65) Prior Publication Data

US 2015/0197846 A1    Jul. 16, 2015

(51) Int. Cl.
 *H01L 21/02*    (2006.01)
 *C23C 16/455*    (2006.01)
 *C23C 16/44*    (2006.01)

(52) U.S. Cl.
 CPC ...... *H01L 21/0262* (2013.01); *C23C 16/4412* (2013.01); *C23C 16/45502* (2013.01); *H01L 21/02532* (2013.01); *H01L 21/02617* (2013.01)

(58) Field of Classification Search
 CPC ........... H01L 21/0262; H01L 21/02617; H01L 21/02532; C23C 16/4412; C23C 16/45502
 USPC ....................................... 118/715; 156/345.1
 See application file for complete search history.

(56) References Cited

U.S. PATENT DOCUMENTS

| | | | | |
|---|---|---|---|---|
| 5,210,466 A * | 5/1993 | Collins | ................. | C23C 16/509 156/345.44 |
| 5,685,914 A * | 11/1997 | Hills | ................. | H01J 37/32449 118/723 E |
| 5,772,770 A * | 6/1998 | Suda | ................. | C23C 16/4401 118/719 |
| 5,891,350 A * | 4/1999 | Shan | ................. | H01J 37/32477 118/723 E |
| 5,904,957 A * | 5/1999 | Christin | ................. | C23C 16/045 427/248.1 |
| 6,120,605 A * | 9/2000 | Sato | ................. | C23C 16/4401 118/715 |
| 6,156,151 A * | 12/2000 | Komino | ............... | H01J 37/3244 118/715 |
| 6,199,505 B1 * | 3/2001 | Sato | ................. | H01J 37/32082 118/723 E |
| 6,261,408 B1 * | 7/2001 | Schneider | ........... | C23C 16/4412 118/715 |

(Continued)

FOREIGN PATENT DOCUMENTS

TW    201225205 A1    6/2012
TW    I377267    11/2012

*Primary Examiner* — Rudy Zervigon
(74) *Attorney, Agent, or Firm* — Haynes and Boone, LLP

(57) ABSTRACT

The present disclosure is directed an apparatus for regulating gas flow in a deposition chamber during a deposition process. The apparatus includes an interior wall that forms an accommodating portion that accommodates a wafer support structure and an exterior wall disposed opposite the interior wall. The apparatus further includes an upper surface, coupled to both the interior wall and the exterior wall, that has a plurality of openings therethrough. The plurality of openings are configured to distribute a flow of gas originating above the apparatus when the apparatus is positioned over a gas outlet port of the deposition chamber.

20 Claims, 5 Drawing Sheets

(56) References Cited

U.S. PATENT DOCUMENTS

| | | | | |
|---|---|---|---|---|
| 6,485,604 B1* | 11/2002 | Okayama | C23C 16/4405 | 118/723 E |
| 6,531,069 B1* | 3/2003 | Srivastava | H01J 37/3244 | 118/723 R |
| 6,656,283 B1* | 12/2003 | Lill | C23C 14/564 | 118/715 |
| 6,669,988 B2 | 12/2003 | Daws | C23C 16/045 | 427/249.2 |
| 6,889,627 B1* | 5/2005 | Hao | H01J 37/32458 | 118/715 |
| 6,942,893 B2* | 9/2005 | Delperier | C04B 35/83 | 118/719 |
| 6,963,043 B2* | 11/2005 | Fink | H01J 37/32642 | 118/723 R |
| 7,198,677 B2* | 4/2007 | Yoo | C23C 16/0236 | 118/715 |
| 7,476,419 B2* | 1/2009 | Rudolph | C23C 16/045 | 177/245 |
| 7,648,610 B2* | 1/2010 | Komiya | C23C 16/4412 | 118/715 |
| 7,955,986 B2* | 6/2011 | Hoffman | H01J 37/32091 | 118/723 E |
| 8,617,347 B2* | 12/2013 | Kim | C23C 16/4412 | 118/715 |
| 8,858,754 B2* | 10/2014 | Horiguchi | H01J 37/3244 | 118/723 E |
| 8,973,527 B2* | 3/2015 | Nozawa | C23C 16/4412 | 118/723 R |
| 9,184,072 B2* | 11/2015 | Devine | H01L 21/67069 | |
| 2002/0134308 A1* | 9/2002 | Amano | C23C 16/4412 | 118/715 |
| 2003/0094135 A1* | 5/2003 | Komiya | C23C 16/4412 | 118/715 |
| 2004/0129218 A1* | 7/2004 | Takahashi | H01J 37/32834 | 118/715 |
| 2005/0167052 A1* | 8/2005 | Ishihara | H01J 37/32834 | 156/345.47 |
| 2005/0224179 A1* | 10/2005 | Moon | H01J 37/32834 | 156/345.29 |
| 2005/0224180 A1* | 10/2005 | Bera | C23C 16/4412 | 156/345.33 |
| 2005/0247265 A1* | 11/2005 | Devine | H01L 21/6719 | 118/719 |
| 2006/0011299 A1* | 1/2006 | Condrashoff | H01J 37/32834 | 156/345.47 |
| 2006/0249175 A1* | 11/2006 | Nowak | C23C 16/4405 | 134/1 |
| 2006/0251827 A1* | 11/2006 | Nowak | B05D 3/0209 | 427/558 |
| 2007/0266945 A1* | 11/2007 | Shuto | C23C 16/4585 | 118/723 E |
| 2008/0035605 A1* | 2/2008 | Takahashi | H01J 37/32844 | 216/58 |
| 2009/0028761 A1* | 1/2009 | Devine | H01L 21/67069 | 422/186.04 |
| 2009/0218043 A1* | 9/2009 | Balakrishna | H01J 37/32449 | 156/345.33 |
| 2011/0005680 A1* | 1/2011 | Balakrishna | C23C 16/4412 | 156/345.33 |
| 2011/0290419 A1* | 12/2011 | Horiguchi | H01J 37/3244 | 156/345.29 |
| 2012/0145080 A1* | 6/2012 | Park | C23C 16/4412 | 118/725 |

* cited by examiner

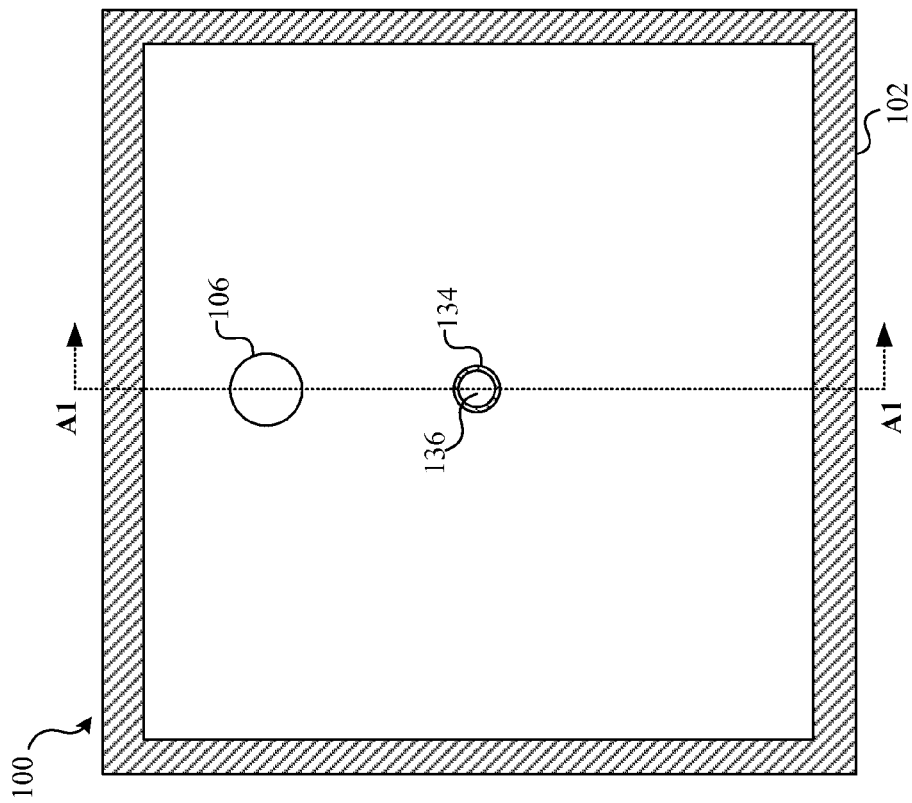
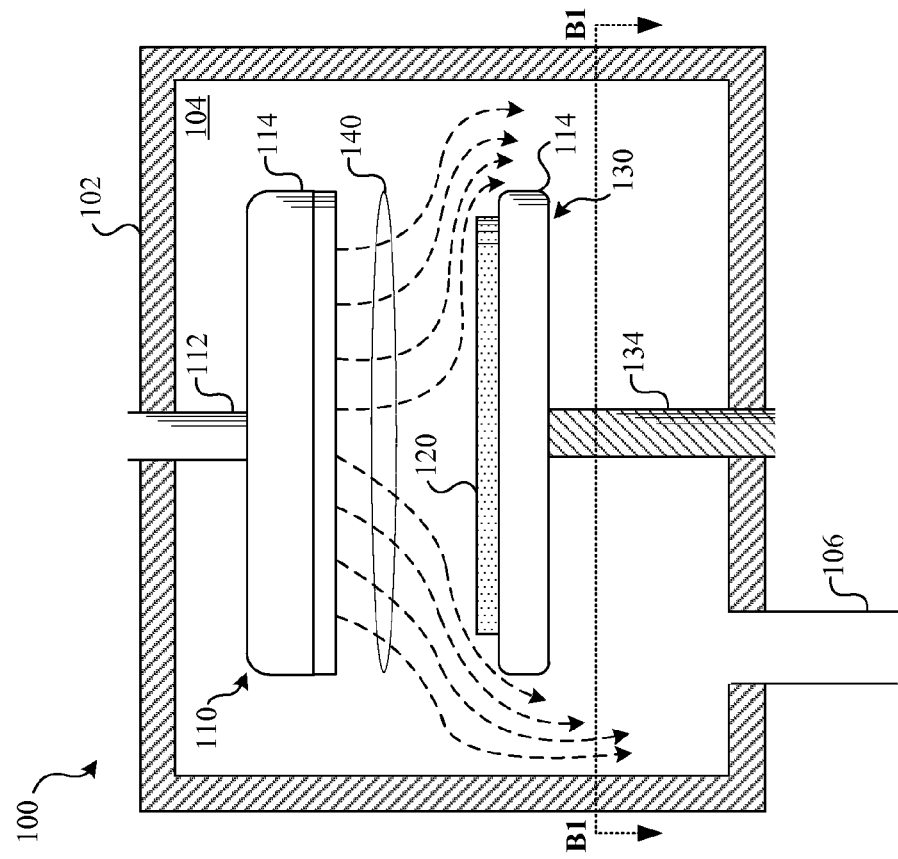

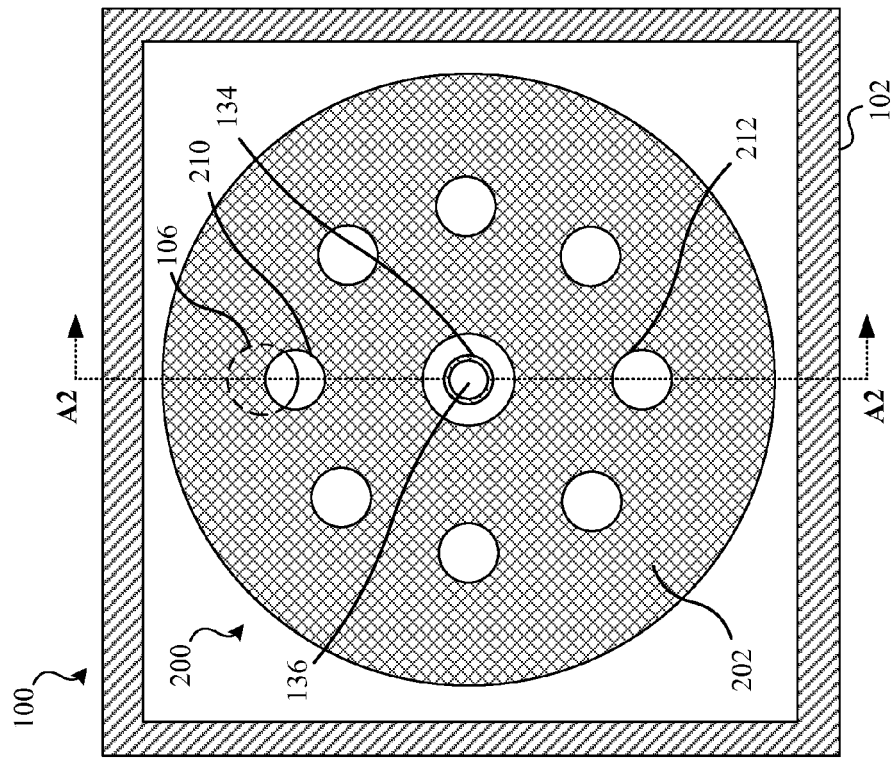
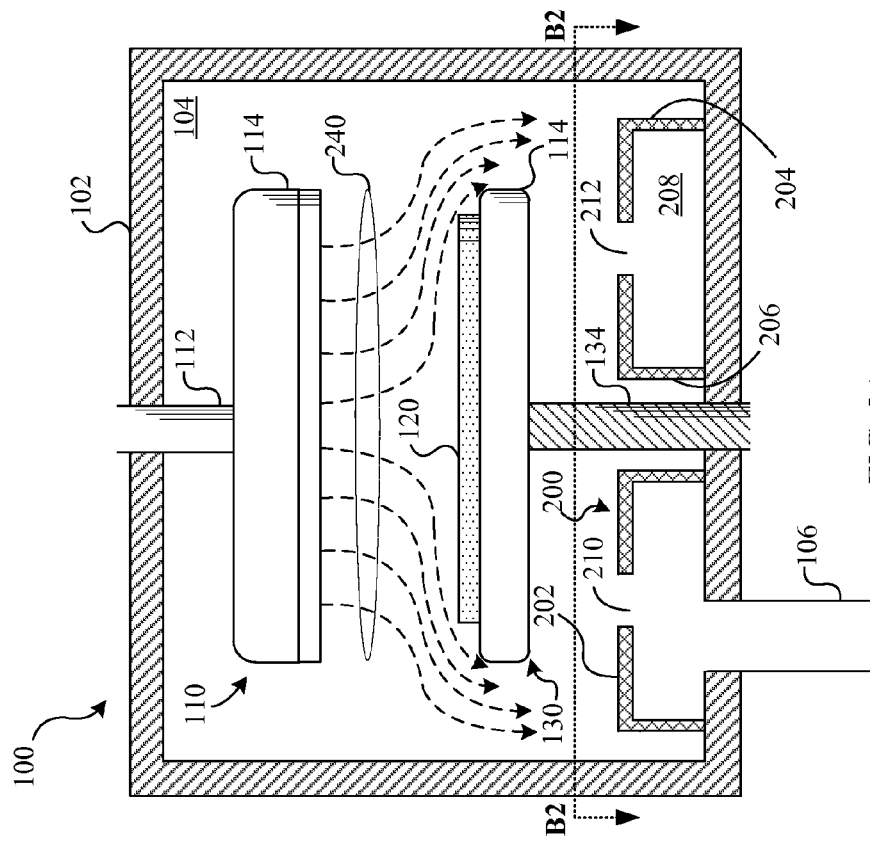
FIG. 2A
FIG. 2B

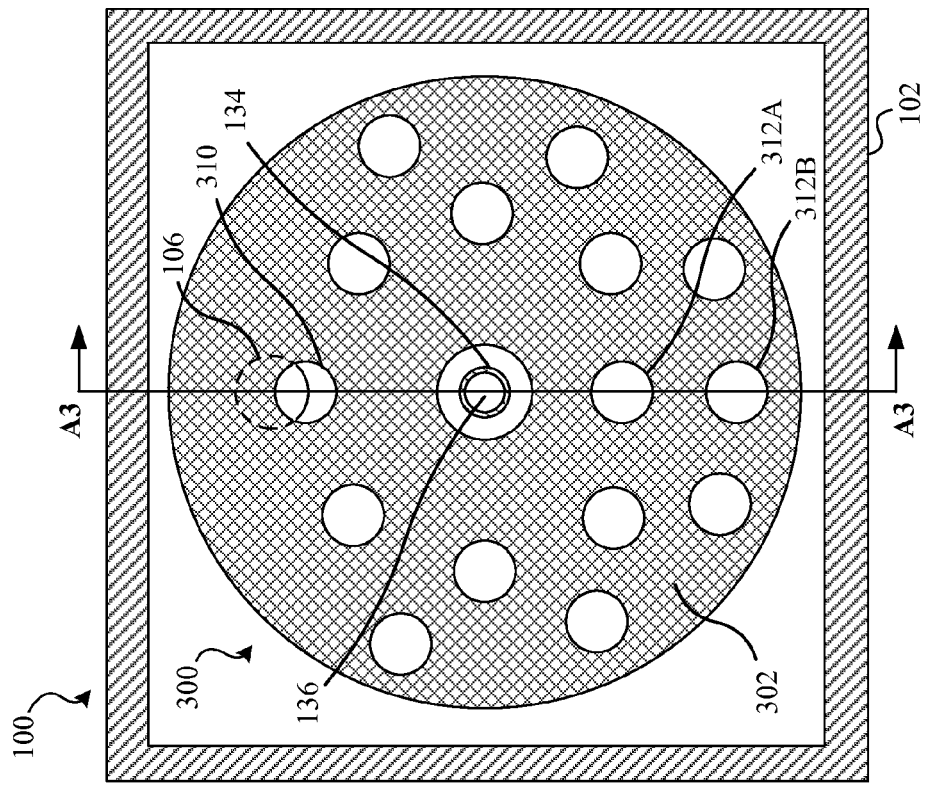
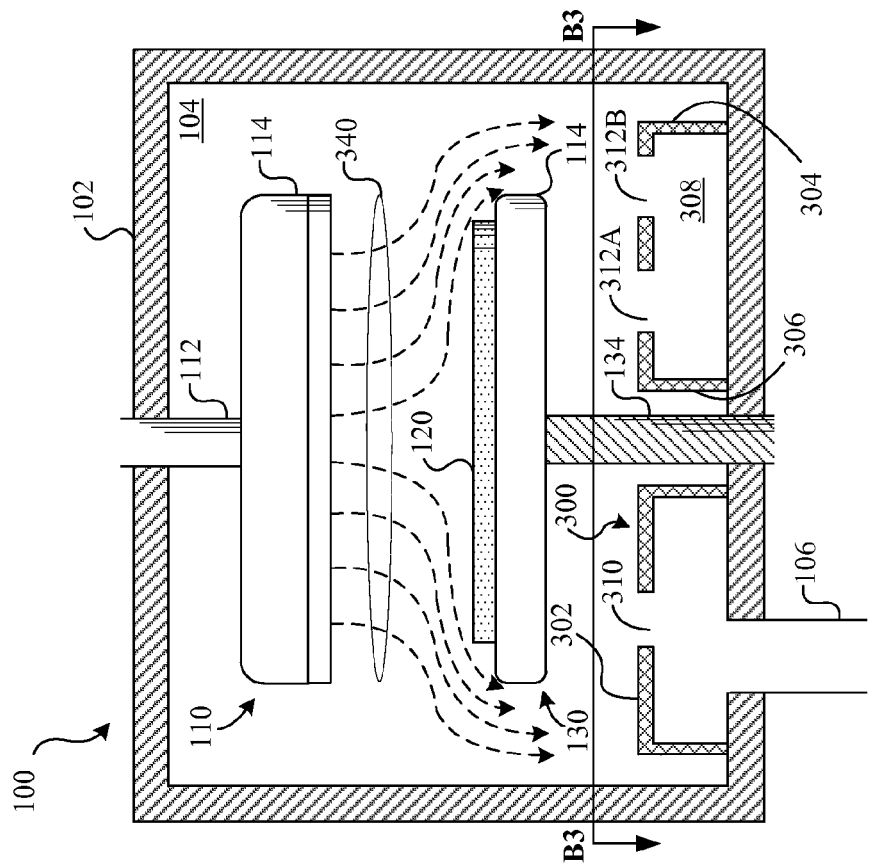
FIG. 3B
FIG. 3A

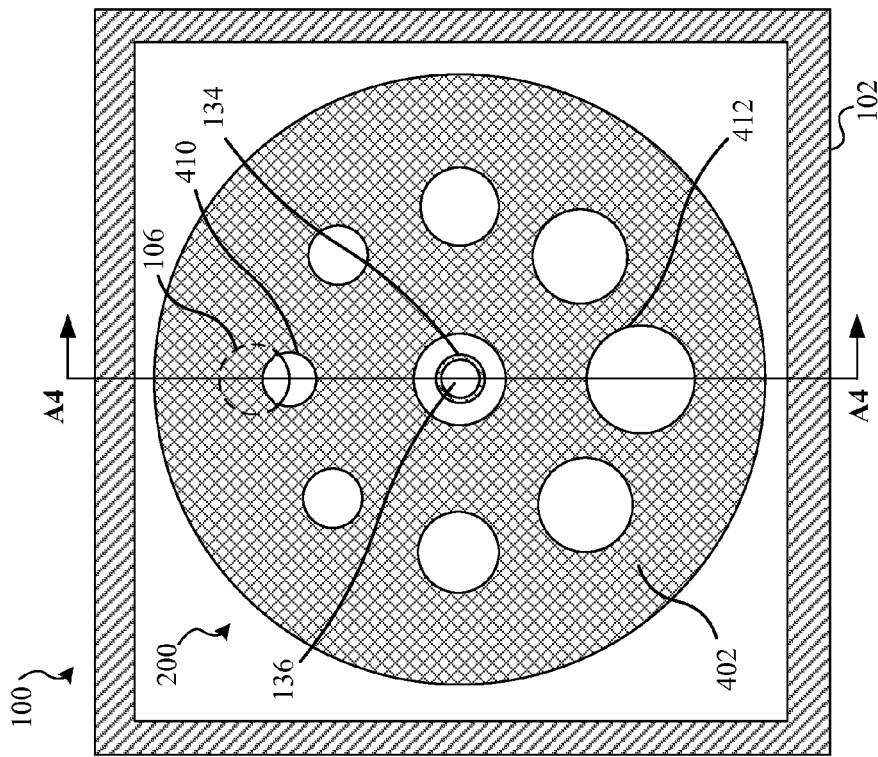
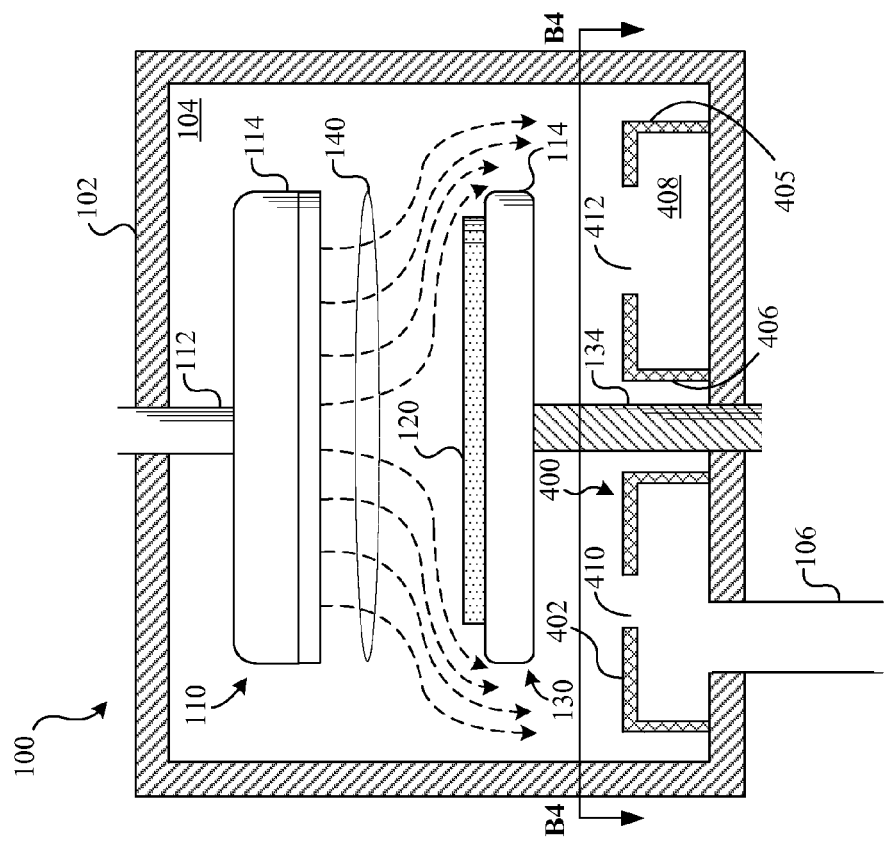
FIG. 4A
FIG. 4B

SYSTEMS AND METHODS FOR UNIFORM GAS FLOW IN A DEPOSITION CHAMBER

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Another trend in the industry is an increase in the diameter of substrates on which semiconductor devices are formed. Over the years, transitions have been made in the industry from 100 to 200 millimeters, from 200 to 300 millimeters, and now from 300 to 450 millimeters. As the substrates have increased in size, the difficulty of forming uniform material layers on a wafer has increased as well. Current deposition chambers have not been completely satisfactory is creating such material layers.

BRIEF DESCRIPTION OF THE DRAWINGS

Aspects of the present disclosure are better understood by reference to the accompanying figures. It is emphasized that, in accordance with the standard practice in the industry, various features are not drawn to scale. In fact, the dimensions of the various features may be arbitrarily increased or reduced for clarity of discussion.

FIG. 1A is a partially cross-sectional diagram of a deposition chamber.

FIG. 1B is another cross-sectional diagram of the entire deposition chamber illustrated in FIG. 1A.

FIG. 2A is a partially cross-sectional diagram of a deposition chamber according to aspects of the present disclosure.

FIG. 2B is another cross-sectional diagram of the entire deposition chamber illustrated in FIG. 2A.

FIG. 3A is a partially cross-sectional diagram of another deposition chamber according to aspects of the present disclosure.

FIG. 3B is another cross-sectional diagram of the entire deposition chamber illustrated in FIG. 3A.

FIG. 4A is a partially cross-sectional diagram of an additional deposition chamber according to aspects of the present disclosure.

FIG. 4B is another cross-sectional diagram of the entire deposition chamber illustrated in FIG. 4A.

Figure 5:
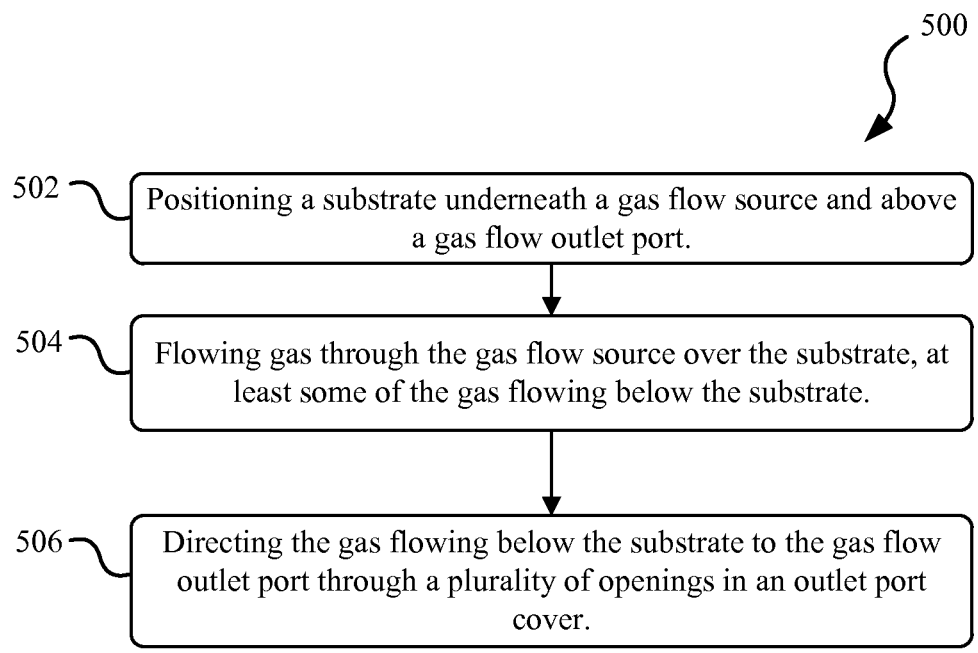
FIG. 5 is a flowchart of a method of depositing material uniformly over a substrate according to aspects of the present disclosure.

Aspects of the present disclosure may be best understood by viewing the accompanying figures with reference to the detailed description provided below.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Referring now to FIG. 1, a deposition chamber 100 is illustrated in partial cross-section. The deposition chamber 100 is a material deposition chamber for depositing material layers on a substrate during fabrication of a semiconductor device wafer, and may be used to deposit layers using techniques such as chemical vapor deposition (CVD), physical vapor deposition (PVD), and other deposition methods in which a gas is flowed over one or more substrates. In FIG. 1, a chamber housing 102, defining a chamber volume 104, and a pump port 106 are shown in cross-section. The chamber housing 102 is illustrated as being sized to fit a single wafer. However, some embodiments of the chamber housing 102 may be large enough to contain many wafers during a deposition process. The chamber housing 102 includes one or more wafer inlets and outlets (not depicted) to allow the insertion and removal of wafers from the chamber volume 104. Alternatively, the chamber housing 102 may include separable portions that can be separated for insertion and removal of wafers and secured together during operation.

The pump port 106 is a gas outlet port (and may be referred to herein as an outlet port 106) that is used to remove one or more gases introduced into the chamber volume 104 during deposition. A pump (not depicted) may be coupled to the outlet port 106 in order to provide a lower pressure at the outlet port in order to promote a flow of gas through the chamber volume 104.

FIG. 1 also illustrates several features of the deposition chamber 100 that are not shown in cross-section, but are instead shown in a coinciding side view. A shower head 110 is provided as a gas flow source in an upper portion of the chamber volume 104 and includes a gas supply line 112 and a flow distributor 114. The gas supply line 112 may be coupled to pressurized gas sources to allow for the introduction of the precursor gas into the chamber housing 102. In embodiments in which the gas flow source is positioned in the upper portion of the chamber volume 104, gravity may assist in the distribution and flow of gas through the chamber volume 104. A difference in pressures at the shower head 110 and the outlet port 106 also provides for the flow of gas through the chamber volume 104.

As a precursor gas enters the chamber volume 104 from the flow distributor 114, it flows onto a substrate 120 which is positioned and supported by a wafer pedestal 130. The wafer pedestal 130 includes a wafer table 132 and a wafer support structure 134 that holds the wafer table 132 above a bottom of the chamber volume 104. As illustrated in FIG. 1A the wafer pedestal 130 supports a single substrate 120. However, in some embodiments more than one substrate is supported on the wafer pedestal 130 during a deposition process. The wafer pedestal 130 may include several features that can be used during a deposition process. The wafer table 132 may include a heater and a temperature sensor to control and/or monitor a temperature of the substrate 120 and a vacuum system to secure the substrate 120 in position during deposition. The wafer support structure 134 may provide electricity and a vacuum to the wafer table 132 and may also provide for the controlled altering of a position of the wafer table 132 and, thereby, the substrate 120. For example, the wafer support structure 134 may be coupled to motors and servos to elevate, lower, and/or rotate the wafer table 132.

FIG. 1B shows a cross-sectional view as seen according to a line B1-B1 of FIG. 1A. Similarly, FIG. 1A is partially cross-sectioned according to the line A1-A1 of FIG. 1B. FIG. 1B illustrates that the outlet port 106 is configured off-center or offset from the center of the bottom of the chamber housing 102. Also shown is a hollow interior 136 of the wafer support structure 134. Electricity and vacuum or low pressure may be supplied to the wafer table 132 through the hollow interior 136 of the wafer support structure 134.

Returning to FIG. 1A, a plurality of dashed-line arrows are included to illustrate a gas flow 140. The gas flow 140 indicates the path of a flow of gas at various positions within the chamber volume 104 over a period of time. The gas flow 140 may be a flow of gaseous hexachlorodisilane (HCD or $Si_2Cl_6$), dichlorosilane (DCS or $SiH_2Cl_2$), bis-(tertiary butyl amino) silane (BTBAS or $C_8H_{22}N_2Si$) or disilane (DS or $Si_2H_6$), or another PVD or CVD precursor gas. The gas flow 140 of FIG. 1A indicates that gas on a side of the chamber housing 102 that includes the outlet port 106, and so the gas is closer thereto, may travel more quickly than gas introduced through the shower head 110 on a side opposite the outlet port 106. Because the rates of gas flow illustrated by gas flow 140 is not uniform, a material layer deposited on the substrate 120 (or a plurality of substrates) may not be uniform. The faster flow on the outlet port side of the chamber volume 104 may result in a smaller or larger layer thickness of deposited material on one side of the substrate 120 than on the other. As the size of a given substrate 120 increases the variations in the resulting material layer may become more significant.

FIGS. 2A and 2B illustrate the deposition chamber 100 with an outlet port cover 200 positioned within the chamber housing 102 and over the outlet port 106. FIG. 2B is a cross-sectional view as seen according to a line B2-B2 of FIG. 2A. Similarly, FIG. 2A is a partially cross-sectional view as seen according to the line A2-A2 of FIG. 2B. The outlet port cover 200 includes an upper surface 202 that is supported by and separated from a bottom of the chamber housing 102 by an exterior wall 204. The illustrated embodiment further includes an interior wall 206 opposite the exterior wall 204. As illustrated, the interior wall 206 has a cylindrical shape that accommodates the cylindrical cross-section of the wafer support structure 134. A separation distance between the interior wall 206 and the wafer support structure 134 is present in FIGS. 2A and 2B, but in some embodiments the interior wall 206, or a portion thereof, conformingly abuts the wafer support structure 134.

The outlet port cover 200 may be installed during assembly of the deposition chamber 100 or may be retrofitted into an existing deposition chamber by removal and subsequent replacement of the wafer table 132. The outlet port cover 200 may be permanently fixed to the bottom of the chamber housing 102, such as by bolting or welding, or may be replaceably positioned therein. Additionally, the upper surface 202 may be planar or contoured to promote gas flow uniformity.

The upper surface 202 and the exterior and interior walls 204 and 206 of the outlet port cover 200 define an internal space 208 that is accessible by a plurality of openings or holes. Two openings of the plurality are illustrated in the cross-sectional view of the outlet port cover 200 in FIG. 2A: a near opening 210 and a far opening 212. The near opening 210 is closer to the outlet port 106 than the far opening 212 is. As seen in FIG. 2B, the upper surface 202 includes 8 total openings like openings 210 and 212. The openings are illustrated as circular, but in some embodiments the openings may be triangular, oval, square, other another shape. Some embodiments include openings having different shapes. The plurality of openings is arranged symmetrically relative to a center of the upper surface 202, which, while illustrated as annular in shape in FIG. 2B, may be generally rectangular or another shape in other embodiments.

The outlet port cover 200 regulates the flow of gas from the shower head 110 to the outlet port 106 so that it is more uniform. Thus, a gas flow 240 may be more uniform than the gas flow 140 seen in FIG. 1A. By regulating the flow of gas to make it more uniform across the wafer 120, the outlet port cover 200 may facilitate the deposition of more uniform material layers. The increased uniformity of deposited material layers may provide semiconductor devices with higher yield and improved performance.

FIGS. 3A and 3B illustrate the deposition chamber 100 with an outlet port cover 300 positioned within the chamber housing 102. FIG. 3B is a cross-sectional view as seen according to a line B3-B3 of FIG. 3A, which is a partial cross-section as seen according to the line A3-A3 in FIG. 3B. The outlet port cover 300 shares many of the features described above in connection with the outlet port cover 200 of FIGS. 2A and 2B. For example, the outlet port cover 300 includes an upper surface 302, an exterior wall 304, and an interior wall 306 that accommodates the wafer support structure 134. The outlet port cover 300 and the chamber housing 102 define an internal space 308 that is directly accessible by a plurality of openings and the outlet port 106.

Unlike the outlet port cover 200, the outlet port cover 300 includes an asymmetrically arranged plurality of openings. As seen in FIG. 3A, the upper surface 302 has a single near opening 310 and two far openings 312A and 312B. As seen in FIG. 3B, the plurality of openings is asymmetric with respect to the wafer support structure 134, but is symmetric with respect to an imaginary line between the outlet port 106 and the support structure 134. In some embodiments, the plurality of openings in the upper surface 302 may have no symmetries, being completely asymmetric.

As seen in FIG. 3B, there are fewer openings on a near side of the outlet port cover 300 than there are on a far side thereof. In the illustrated embodiment, all of the openings have identical geometries. Thus, the outlet port cover 300 includes more open area on the far side than on the near side. This may improve the uniformity of the gas flow 340 as seen in FIG. 3A. The larger open area provided by the more numerous openings on the far side of the outlet port cover 300 may counteract an effect derived by the proximity of the openings on the near side to the outlet port 106. Thus, although the gas flow may not be uniform within the internal space 308, above the upper surface 302 the gas flow 340 may be more uniform.

FIGS. 4A and 4B illustrate the deposition chamber 100 with an outlet port cover 400 positioned within the chamber volume 104. FIG. 4B is a cross-sectional view as seen according to a line B4-B4 of FIG. 4A, which is a partial cross-section as seen according to the line A4-A4 in FIG. 4B. The outlet port cover 400 may share many features and properties with the outlet port covers 200 and 300 of FIGS. 2A and 2B and FIGS. 3A and 3B. The outlet port 400 has an upper surface 402 with a plurality of openings therethrough. The upper surface 402 is coupled to and supported by an exterior wall 404 and an interior wall 406, offsetting the upper surface 402 from the bottom of the chamber housing 102. Together, the outlet port cover 400 and the chamber housing 102 form an internal space 408. As seen in FIG. 4A, the plurality of openings includes a near opening 410 and a far opening 412. The near opening 410 has a smaller diameter than the far opening 412, and the openings of the plurality increase in diameter within increasing distance from the outlet port 106, as seen in FIG. 4B. This provides a greater open area on a far side of the upper surface 402 than on a near side, which may counteract a faster flow due to the proximity of the openings on the near side to the outlet port 106 and thereby promote a uniform gas flow 440 as illustrated in FIG. 4A. This increased uniformity may provide higher quality, super performing semiconductor devices and increased yields.

Combinations of the various features of the outlet port covers 200, 300, and 400, are within the scope of this disclosure. In some embodiments of outlet port covers, an upper surface may have openings that form about 20 to about 80 percent of a total surface area of the upper surface. The combined area of the openings on an upper surface may range from about 20 square centimeters to about 1400 square centimeters. The openings may be symmetrical with respect to certain features of a deposition chamber or may be asymmetrical. The upper surface may be planar, convex, or concave, or have a combination of such areas. The outlet port covers may be formed from a ceramic material or from a metal, such as stainless steel, that can withstand the elevated temperatures that can occur in a CVD, PVD, or other deposition process involving flowing gases. The outlet port covers described above may provide for increased uniformity in the gas flow over one or more substrates undergoing a material layer deposition process. This may provide yield and device quality benefits.

FIG. 5 is a flowchart of a method 500 of depositing a material uniformly over a substrate. The method 500 includes several enumerated steps as illustrated in FIG. 5, but embodiments of the method 500 may include additional steps before, after, and in between the enumerated steps. Thus, the method 500 may begin in step 502 in which a substrate is inserted into a deposition chamber and positioned underneath a gas flow source and above a gas outlet port. The gas outlet port is off-center within the deposition chamber. Such a deposition chamber is illustrated in FIGS. 2A and 2B by the deposition chamber 100 having the shower head 110 and the outlet port 106. In step 504, gas is flowed through the gas flow source over the substrate, at least some of the gas flowing below the substrate. As shown in FIG. 2A, a gas that enters the chamber volume 104 through the shower head 110 flows down over the substrate 120, where some of the gas reacts to deposit a material layer. Alternatively the gas may react above the surface of the substrate 120, such that the reacted material deposits down onto the substrate 120. At least some of this gas and/or by-product gases produced from a reaction with the precursor gas, flows below the substrate 120. In step 506, this flowing gas is directed to the gas outlet port through a plurality of openings in an outlet port cover. The plurality of openings are configured to cause, regulate, or direct the gas flowing from the gas flow source and the plurality of openings to flow in a substantially uniform manner through the upper surface of the outlet port cover. For example, the outlet port covers 200, 300, or 400 as described above may direct the gas to flow from the shower head 110 more uniformly over the substrate 120.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

In one exemplary aspect, the present disclosure is directed an apparatus for regulating gas flow in a deposition chamber. The apparatus includes an interior wall that forms an accommodating portion that accommodates a wafer support structure and an exterior wall disposed opposite the interior wall. The apparatus further includes an upper surface, coupled to both the interior wall and the exterior wall, that has a plurality of openings therethrough. The plurality of openings are configured to distribute a flow of gas originating above the apparatus when the apparatus is positioned over a gas outlet port of the deposition chamber.

In another exemplary aspect, the present disclosure is directed to a deposition chamber. The deposition chamber includes a chamber housing with a gas flow source disposed in an upper region of the chamber housing and a gas outlet port positioned on a bottom surface of the chamber housing. The gas outlet port is offset from a center of the bottom surface. The deposition chamber also includes a wafer pedestal configured to position a wafer underneath the gas flow source and an outlet port cover that has an upper surface with a plurality of openings therethrough. The plurality of openings are configured to regulate a flow of gas from the gas flow source to the gas outlet port.

What is claimed is:

1. A deposition chamber comprising: a chamber housing; a gas flow source disposed in an upper region of the chamber housing; a gas outlet port positioned on a bottom inner surface of the chamber housing and offset from a center of the bottom inner surface; a wafer pedestal configured to position a wafer underneath the gas flow source, the wafer pedestal comprising a wafer support structure; and an outlet port cover that has an upper surface with a plurality of openings there through configured to regulate a flow of gas from the gas flow source to the gas outlet port, wherein at least one of the plurality of openings is positioned directly underneath the wafer pedestal, the outlet port cover disposed on the bottom inner surface of the chamber housing and not physically contacting sidewalls of the chamber housing and not physically contacting the wafer pedestal, wherein a first sidewall of the outlet port cover is disposed directly underneath the wafer pedestal and a second sidewall of the outlet port cover opposite the first sidewall is not disposed directly underneath the wafer pedestal, wherein the first sidewall and the second sidewall extend up from the bottom inner surface of the chamber housing and parallel to the perimeter walls of the wafer support structure, wherein the plurality of openings includes a first opening and a second opening, the first opening disposed directly over a portion of the gas outlet port such that a first axis extending through the first opening and perpendicular to the gas outlet port intersects the gas outlet port, the second opening disposed directly over the bottom inner surface such that a second axis extending through the second opening and perpendicular to the bottom inner surface intersects the bottom inner surface without intersecting the gas outlet port.

2. The deposition chamber of claim 1, wherein the wafer pedestal comprises a wafer table, the wafer support structure being centered within the chamber housing, and wherein the outlet port cover has an accommodating hole therethrough through which the wafer support structure passes, and wherein the wafer support structure extends through the bottom inner surface.

3. The deposition chamber of claim 1, wherein the plurality of openings of the upper surface of the outlet port cover is spaced uniformly away from a center of the outlet port cover.

4. The deposition chamber of claim 1, wherein the upper surface is annular in shape.

5. The deposition chamber of claim 1, wherein the plurality of openings includes openings on a first half of the upper surface and openings on a second half of the upper surface opposite the first half, wherein the gas outlet port is directly underneath the first half, and wherein the openings on the second half of the upper surface provide a greater combined open area than the openings on the first half of the upper surface.

6. The deposition chamber of claim 1, wherein the outlet port cover is made from a ceramic material or metal.

7. A deposition chamber comprising: a chamber housing; a gas flow source disposed in an upper region of the chamber housing; a single gas outlet port positioned on a bottom surface of the chamber housing; a wafer pedestal configured to position a wafer between the gas flow source and the gas outlet port, the wafer pedestal comprising a support structure; and an outlet port cover in the chamber housing and positioned between the gas flow source and the gas outlet port, the outlet port cover disposed on the bottom surface of the chamber housing and not physically contacting sidewalls of the chamber housing and not physically contacting the wafer pedestal, wherein a first sidewall of the outlet port cover is disposed directly underneath the wafer pedestal and a second sidewall of the outlet port cover opposite the first sidewall is not disposed directly underneath the wafer pedestal, wherein the first sidewall and the second sidewall extend up from the bottom surface of the chamber housing and parallel to the perimeter walls of the support structure, wherein the outlet port cover has an upper surface with a plurality of openings configured to regulate a flow of gas from the gas flow source to the gas outlet port, and wherein at least one of the plurality of openings is positioned directly underneath the wafer, and wherein the plurality of openings includes a first opening and a second opening, the first opening disposed directly over a portion of the gas outlet port such that a first axis extending through the first opening and perpendicular to the gas outlet port intersects the gas outlet port, the second opening disposed directly over the bottom surface such that a second axis extending through the second opening and perpendicular to the bottom surface intersects the bottom surface without intersecting the gas outlet port.

8. The deposition chamber of claim 7 wherein the wafer pedestal is positioned between the gas flow source and the outlet port cover.

9. The deposition chamber of claim 7, wherein each opening of the plurality of openings is spaced uniformly away from a center of the outlet port cover.

10. The deposition chamber of claim 7, wherein the upper surface is annular in shape.

11. The deposition chamber of claim 7, wherein:
the gas outlet port is positioned offset from a center of the bottom surface; and
the plurality of openings includes openings on a first half of the upper surface and openings on a second half of the upper surface, wherein the gas outlet port is directly underneath the first half, and the openings on the second half of the upper surface provide a greater combined open area than the openings on the first half of the upper surface.

12. The deposition chamber of claim 7, wherein:
the gas outlet port is positioned offset from a center of the bottom surface; and
the plurality of openings includes a first number of openings on a first half of the upper surface and a second number of openings on a second half of the upper surface, wherein the gas outlet port is directly underneath the first half, and the second number is greater than the first number.

13. The deposition chamber of claim 7, wherein a combined open area provided by the plurality of openings is in a range of about 20 percent to about 80 percent of a total surface area of the upper surface.

14. The deposition chamber of claim 7, wherein the plurality of openings is symmetric about a first diameter passing through a center of the gas outlet port and is asymmetric about a second diameter which is perpendicular to the first diameter.

15. A deposition chamber for semiconductor manufacturing, comprising: a chamber housing; a gas flow source disposed in the chamber housing and configured to introduce a gas into the chamber housing; a gas outlet port disposed away from the gas flow source on a bottom surface of the chamber housing and configured such that the gas flows from the gas flow source to the gas outlet port; a wafer pedestal configured to position a wafer between the gas flow source and the gas outlet port, the wafer pedestal comprising a shaft; and an outlet port cover that has an upper surface with a plurality of openings configured to regulate a flow of the gas to be generally uniform across the wafer, the outlet port cover disposed on the bottom surface of the chamber housing and not physically contacting sidewalls of the chamber and not physically contacting the wafer pedestal, wherein a first sidewall of the outlet port cover is disposed directly underneath the wafer pedestal and a second sidewall of the outlet port cover opposite the first sidewall is not disposed directly underneath the wafer pedestal, wherein the first sidewall and the second sidewall extend up from the bottom surface of the chamber housing and parallel to the perimeter walls of the shaft, wherein at least one of the plurality of openings is positioned directly beneath the wafer pedestal, and wherein the plurality of openings includes a first opening and a second opening, the first opening disposed directly over a portion of the gas outlet port such that a first axis extending through the first opening and perpendicular to the gas outlet port intersects the gas outlet port, the second opening disposed directly over the bottom surface of the chamber housing such that a second axis extending through the second opening and perpendicular to the bottom surface intersects the bottom surface without intersecting the gas outlet port.

16. The deposition chamber of claim 15, wherein the outlet port cover is positioned between the wafer pedestal and the gas outlet port.

17. The deposition chamber of claim 15, wherein:
the gas outlet port is positioned offset with respect to a center of the wafer pedestal; and
the plurality of openings includes openings on a first half of the upper surface and openings on a second half of the upper surface, wherein the gas outlet port is directly underneath the first half, and the openings on the second half of the upper surface provide a greater combined open area than the openings on the first half of the upper surface.

18. The deposition chamber of claim 15, wherein the upper surface is annular in shape and the plurality of openings is spaced non-uniformly away from a center of the outlet port cover.

19. The deposition chamber of claim 1, wherein the plurality of openings includes openings on a first half of the upper surface and openings on a second half of the upper surface opposite the first half, wherein the gas outlet port is directly underneath the first half, and wherein the openings on the second half of the upper surface have a larger diameter than the openings on the first half of the upper surface.

20. The deposition chamber of claim 2, wherein the first opening of the outlet port cover is disposed on a first side of the wafer support structure and the second opening of the outlet port cover is disposed on a second side of the wafer support structure, the second side being opposite the first side.

* * * * *